(12) United States Patent
Suezaki et al.

(10) Patent No.: US 7,678,992 B2
(45) Date of Patent: Mar. 16, 2010

(54) THIN-FILM PHOTOELECTRIC CONVERTER

(75) Inventors: Takashi Suezaki, Moriyama (JP); Masashi Yoshimi, Kobe (JP); Toshiaki Sasaki, Ohtsu (JP); Yuko Tawada, Settsu (JP); Kenji Yamamoto, Kobe (JP)

(73) Assignee: Kaneka Corporation, Osaka (JP)

( * ) Notice: Subject to any disclaimer, the term of this patent is extended or adjusted under 35 U.S.C. 154(b) by 1266 days.

(21) Appl. No.: 10/543,516

(22) PCT Filed: May 28, 2004

(86) PCT No.: PCT/JP2004/007803

§ 371 (c)(1),
(2), (4) Date: Jul. 27, 2005

(87) PCT Pub. No.: WO2004/114417

PCT Pub. Date: Dec. 29, 2004

(65) Prior Publication Data

US 2006/0097259 A1    May 11, 2006

(30) Foreign Application Priority Data

Jun. 19, 2003   (JP) .............................. 2003-174423

(51) Int. Cl.
*H01L 31/00* (2006.01)
(52) U.S. Cl. ................. 136/252; 257/431; 438/330; 438/191
(58) Field of Classification Search .................. 136/252
See application file for complete search history.

(56) References Cited

U.S. PATENT DOCUMENTS

2003/0036216 A1   2/2003  Suezaki et al.

FOREIGN PATENT DOCUMENTS

EP            1041646 A1       4/2000

(Continued)

OTHER PUBLICATIONS

Machine Translation of Kurasamu (JP 2002-261015) (Sep. 13, 2002).*

(Continued)

*Primary Examiner*—Jennifer K Michener
*Assistant Examiner*—Xiuyu Tai
(74) *Attorney, Agent, or Firm*—Hogan & Hartson LLP

(57) ABSTRACT

A thin film photoelectric converter, especially an integrated thin film photoelectric converter having improved photoelectric conversion efficiency is provided by controlling an open-circuit voltage and a fill factor so as not be small in a thin film photoelectric converter including a crystalline silicon photoelectric conversion unit. The thin film photoelectric converter by the present invention has at least a transparent electrode film, a crystalline silicon photoelectric conversion unit, and a back electrode film formed sequentially on one principal surface of a transparent substrate, and the converter has a whitish discoloring area on a part of a surface of the converter after formation of the crystalline silicon photoelectric conversion unit. A percentage of dimensions of the whitish discoloring area preferably is not more than 5% of a dimension of the photoelectric conversion area. A thin film photoelectric converter of the present invention is preferably an integrated thin film photoelectric converter.

3 Claims, 8 Drawing Sheets

FOREIGN PATENT DOCUMENTS

| | | |
|---|---|---|
| EP | 1049144 A1 | 11/2000 |
| EP | 1198013 A2 | 4/2002 |
| EP | 1198014 A2 | 4/2002 |
| EP | 1478030 A1 | 11/2004 |
| JP | 62-295466 | 12/1987 |
| JP | 07-007168 | 1/1995 |
| JP | 07-254568 | 10/1995 |
| JP | 11-330520 | 11/1999 |
| JP | 2002-111028 | 4/2002 |
| JP | 2002-261015 | 9/2002 |
| JP | 2002-319692 | 10/2002 |

OTHER PUBLICATIONS

Supplemental Search Report for European Patent Application No. 04735406.3-1235 lists references above.

* cited by examiner

51

THIN-FILM PHOTOELECTRIC CONVERTER

This application is a nationalization of PCT application PCT/JP2004/007803 filed on May 28, 2004, claiming priority to Japanese Application No. 2003-174423 filed on Jun. 19, 2003.

TECHNICAL FIELD

The present invention relates to improvement in conversion efficiency of a thin film photoelectric converter, and more particularly to improvement in conversion efficiency having a large dimension thin film photoelectric converter including crystalline silicon photoelectric conversion units formed by a plasma CVD method.

BACKGROUND ART

Today, thin film photoelectric converters have become in wider use, and crystalline silicon photoelectric converters including crystalline silicon photoelectric conversion units have been developed in addition to amorphous silicon photoelectric converters including conventional amorphous silicon photoelectric conversion units. And moreover, hybrid type thin film photoelectric converters having these units stacked therein have also been put in practical use. A term "crystalline" as used herein represents also a state including polycrystalline state and microcrystalline state. Terms "crystalline" and "microcrystalline" as used herein represent a state partially including amorphous regions.

A thin film photoelectric converter generally comprises a transparent electrode film sequentially stacked on a transparent substrate, one or more semiconductor thin film photoelectric conversion units, and a back electrode film. And the one semiconductor thin film photoelectric conversion unit includes an i type layer sandwiched by a p type layer and an n type layer.

On one hand, an i type layer occupying a great portion of a thickness of the photoelectric conversion unit is made of a substantially intrinsic semiconductor layer, photoelectric conversion is mainly formed within this i type layer, and therefore the layer is referred to as a photoelectric conversion layer. For larger absorption of light and larger generation of photo current, this i type layer preferably has a greater thickness, but a greater thickness more than needed will result in increase in cost and time for the film-formation.

On the other hand, a p type layer and an n type layer are referred to as a conductive layer, and these layers serve to produce diffusion potential within the semiconductor thin film photoelectric conversion unit. A magnitude of this diffusion potential influences a value of an open-circuit voltage as one of properties of the thin film photoelectric converter. However, these conductive layers are inactive layers with no contribution to photoelectric conversion. That is, light absorbed by impurities doped in the conductive layers does not contribute to power generation, resulting in a loss of light. Consequently, the p-type and n-type conductive layers preferably have a thickness as small as possible in a range for providing a sufficient diffusion potential.

For this reason, in a semiconductor thin film photoelectric conversion unit or a thin film photoelectric converter, when the material of the i type layer occupying a major portion is made of amorphous silicon, the device will be referred to as an amorphous silicon thin film photoelectric converter or an amorphous silicon photoelectric conversion unit. And when the material of the i type layer is made of crystalline silicon, it will be referred to as a crystalline silicon photoelectric converter or a crystalline silicon photoelectric conversion unit. This expression is not dependent on whether materials of the conductive layer included are amorphous or crystalline.

Known methods of improving conversion efficiency of a thin film photoelectric converter involve stacking two or more photoelectric conversion units in tandem. In this method, a front unit including a photoelectric conversion layer having a wider energy band gap is disposed closer to a light incident side of the photoelectric converter, and behind it disposed is a rear unit including a photoelectric conversion layer (of a Si—Ge alloy, for example) having a narrower band gap. This configuration thereby enables photoelectric conversion over a wide wavelength range of incident light to improve conversion efficiency of the entire device.

In such tandem type thin film photoelectric converters, a device including stacked amorphous silicon photoelectric conversion units and crystalline silicon photoelectric conversion units are referred to as a hybrid type thin film photoelectric converter.

For example, wavelengths of light that may be converted into electricity by an i type amorphous silicon are up to approximately 800 nm in a longer wavelength side, but an i type crystalline silicon can convert light with longer wavelengths of approximately 1100 nm into electricity. Here, on one hand, in amorphous silicon photoelectric conversion layers comprising amorphous silicon having a larger light absorption coefficient, a thickness of not more than 0.3 micrometers is enough for sufficient light absorption for photoelectric conversion. On the other hand, however, in a crystalline silicon photoelectric conversion layer comprising crystalline silicon having comparatively smaller light absorption coefficient, it is preferable to have a thickness of not less than about 2 to 3 micrometers in order to fully absorb light with longer wavelengths. That is, a crystalline silicon photoelectric conversion layer usually needs approximately 10 times as large thickness as compared with that for an amorphous silicon photoelectric conversion layer.

In thin film photoelectric converters, needed are devices having larger dimension for larger electric generating capacity and improvement in productive efficiency. There are various problems in realizing a large sized device, for example, Japanese Patent Laid-Open No. 2002-319692 official report discloses a following technique. When a transparent substrate having a transparent conducting layer formed, using plasma CVD device, on one principal surface and having an dimension of not less than 1200 cm$^2$ is held with a substrate holder, and is made to face with an electrode to form a crystalline silicon photoelectric conversion layer with a power flux density of not less than 100 mW/cm$^2$, the substrate holder and the transparent conducting layer on a front face of the transparent substrate are electrically insulated to control abnormal discharge between the substrate holder and the transparent conducting layer on the front face of the transparent substrate. It is assumed that this abnormal discharge occurs, when an amount of electric charge accumulated in the transparent conducting layer exceeds a considerable quantity in escaping of the electric charge held in the transparent conducting layer to the substrate holder. Since a charge quantity escaping at once to the substrate holder is dependent on "dimension of substrate/circumference length of substrate", this value is dependent on a substrate size. The official report describes that when a substrate size is large, specifically, when the substrate size is not less than 1200 cm$^2$, a charge quantity escaping at once exceeds a certain steady value, and then the abnormal discharge easily breaks out.

Thin film photoelectric converters with a large dimension are usually formed as integrated thin film photoelectric converters. Generally an integrated thin film photoelectric converter is stacked on a transparent substrate, and the converter has a structure having a plurality of photoelectric conversion cells comprising a transparent electrode film, one or more semiconductor thin film photoelectric conversion units, and a back electrode film, each having a belt-shape connected in series.

Here, description of an integrated thin film photoelectric converter will be given referring to drawings. Identical referential numerals will be provided with an identical member in each Figure, and overlapping description will be omitted.

FIG. 1 is a schematic plan view showing an integrated thin film photoelectric converter 1. Still more detailed description about the integrated thin film photoelectric converter 1 shown in FIG. 1 will be given. FIG. 2 is a schematic sectional view showing the integrated thin film photoelectric converter 1. The integrated thin film photoelectric converter 1 shown in FIG. 2 is a hybrid type thin film photoelectric converter, and a photoelectric conversion cell 10 has a structure wherein a transparent electrode film 3, an amorphous silicon photoelectric conversion unit 4a provided with an amorphous silicon photoelectric conversion layer, a crystalline silicon photoelectric conversion unit 4b provided with a crystalline silicon photoelectric conversion layer, and a back electrode film 5, a sealing resin layer 6, and an organic protective layer 7 are sequentially stacked on a transparent substrate 2. That is, this integrated thin film photoelectric converter 1 perform photoelectric conversion of light entered from a transparent substrate 2 side by semiconductor thin film photoelectric conversion units 4a and 4b that form a hybrid type structure.

As shown in FIG. 2, a first, and a second isolation grooves 21 and 22 for dividing the thin film, and a connection groove 23 are provided in the integrated thin film photoelectric converter 1. These first and second isolation grooves 21 and 22, and the connection groove 23 are mutually parallel, and extend in a direction perpendicular to a page space. A boundary between adjacent photoelectric conversion cells 10 are specified by the second isolation groove 22.

The first isolation groove 21 divides the transparent electrode film 3 corresponding to each photoelectric conversion cell 10, and has an opening in an interface between the transparent electrode film 3 and the amorphous silicon photoelectric conversion unit 4a, and a surface of the transparent substrate 2 as a bottom. This first isolation groove 21 is filled with an amorphous material constituting the amorphous silicon photoelectric conversion unit 4a, and the material electrically insulates the adjacent transparent electrode films 3 from each other.

The second isolation groove 22 is provided in a position distant from the first isolation groove 21. The second isolation groove 22 divides the semiconductor thin film photoelectric conversion units 4a and 4b, and the back electrode film 5 corresponding to each photoelectric conversion cell 10, and the groove 22 has an opening in an interface between the back electrode film 5 and the sealing resin layer 6, and it has a surface of transparent electrode film 3 as a bottom. This second isolation groove 22 is filled with a sealing resin layer 6, and the resin electrically insulates the back electrode films 6 from each other between the adjacent photoelectric conversion cells 10.

The connection groove 23 is provided between the first isolation groove 21 and the second isolation groove 22. This connection groove 23 divides the semiconductor thin film photoelectric conversion units 4a and 4b, and has an opening in an interface between the crystalline silicon photoelectric conversion unit 4b and the back electrode film 5, and a surface of the transparent electrode film 3 as a bottom. This connection groove 23 is filled with a metallic material constituting the back electrode film 5, and the metallic material electrically connects one of the back electrode film 5 of the adjacent photoelectric conversion cells 10 with another transparent electrode film 3. That is, the connection groove 23 and the metallic material charged therein play a role in connecting in series the photoelectric conversion cells 10 aligned on the substrate 1 with each other.

By the way, in such an integrated thin film photoelectric converter 1, since the photoelectric conversion cells 10 are connected in series, a current value of whole of the integrated thin film photoelectric converter 1 during photoelectric conversion becomes equal to a current value of a photoelectric conversion cell 10, in a plurality of photoelectric conversion cells 10, having the minimum photo current generated in photoelectric conversion. And, as a result an excessive photo current in other photoelectric conversion cells 10 makes a loss. Then, investigations have been made for keeping uniform a quality of a film in a surface of the crystalline silicon photoelectric conversion unit 4b. That is, in the integrated thin film photoelectric converter 1 including the crystalline silicon photoelectric conversion unit 4b, in order to reduce the electric current loss mentioned above, efforts have been made to acquire high photoelectric conversion efficiency by reducing formation of an area generating only a small photo current due to difference of crystallinity in the crystalline silicon photoelectric conversion layer, and furthermore by making in-plane quality of the film uniform.

At this time, areas having a smaller photo current generated in the crystalline silicon photoelectric conversion layer may be distinguished from normal areas by visual observation of a side of the film surface after formation of the crystalline silicon photoelectric conversion unit 4b, and it may be observed as a whitish discoloring areas. This phenomenon is attributed to crystallinity difference in the crystalline silicon as a material of the crystalline silicon photoelectric conversion layer. On one hand, sufficient crystallization was not achieved in whitish discoloring areas, and the areas include not only crystalline silicon but much amount of amorphous silicon to give whitish and cloudy appearance, resulting in small amount of photo current. On the other hand, since they are fully crystallized, normal areas are observed as areas having gray appearance without whitish cloudiness, giving larger amount of photo current generated as compared with that from the whitish discoloring areas.

Japanese Patent Laid-Open No. 11-330520 official report discloses that in case of comparatively thin film-formation of an amorphous silicon photoelectric conversion layer, use of a higher pressure within a reaction chamber not less than 667 Pa (5 Torr) enables film-formation of a thicker crystalline silicon photoelectric conversion layer with high quality at a higher speed, instead of a conventionally used pressure of not more than 133 Pa (1 Torr) within a plasma reaction chamber, but the patent fails to provide description about such a whitish discoloring areas.

However, in a hybrid type thin film photoelectric converter or a crystalline thin film photoelectric converter having a dimension of not less than 600 $cm^2$, there has been shown a problem that when the above-mentioned whitish discoloring areas do not exist in the crystalline silicon photoelectric conversion layer at all, areas giving a smaller photo current does not exist, and therefore a short circuit current increases with increase in light sensitivity, but an open-circuit voltage and fill factor will drop.

SUMMARY OF THE INVENTION

In consideration of the above situations, the present invention aims at providing a thin film photoelectric converter, in particular, an integrated thin film photoelectric converter wherein a problem of drop of an open-circuit voltage and a fill factor is solved and simultaneously photoelectric conversion efficiency is improved by prevention of drop of a current value in the thin film photoelectric converter including a crystalline silicon photoelectric conversion unit.

A thin film photoelectric converter by the present invention is a thin film photoelectric converter having at least a transparent electrode film, a crystalline silicon photoelectric conversion unit, and a back electrode film sequentially formed on one principal surface of a transparent substrate thereof, and having a whitish discoloring area in a part of the surface after formation of the crystalline silicon photoelectric conversion unit.

A percentage of the whitish discoloring area is preferably not more than 5% in an dimension of a photoelectric conversion area of the thin film photoelectric converter.

In the thin film photoelectric converter of the present invention, the transparent electrode film, crystalline silicon photoelectric conversion unit, and back electrode film are isolated with a plurality of isolation grooves so as to form a plurality of photoelectric conversion cells; the thin film photoelectric converter may especially preferably have a constitution of an integrated thin film photoelectric converter having these plurality of cells electrically connected with each other in series via grooves for connection.

In the integrated thin film photoelectric converter, the whitish discoloring areas preferably exist with a dimension of not less than 2 mm and not more than 10 mm to the photoelectric conversion area side from a boundary parallel to the direction of series connection of the serially connected photoelectric conversion areas.

A thin film photoelectric converter of the present invention preferably further comprises an amorphous silicon photoelectric conversion unit between the transparent electrode film and the crystalline silicon photoelectric conversion unit.

Furthermore, the thin film photoelectric converter of the present invention is a thin film photoelectric converter having at least a transparent electrode film, a crystalline silicon photoelectric conversion unit, and a back electrode film sequentially formed on one principal surface of a transparent substrate, and a difference of a maximum and a minimum values of an absolute reflectance including diffusion component measured with monochromatic light, having a wavelength of 800 nm, entered from another principal surface side of the transparent substrate is not less than 5% in the photoelectric conversion area.

A thin film photoelectric converter of the present invention especially preferably has a not less than 600 $cm^2$ of dimension having a semiconductor thin film photoelectric conversion unit formed on one principal surface of the transparent substrate.

BEST MODE FOR CARRYING-OUT OF THE INVENTION

Figure 1:
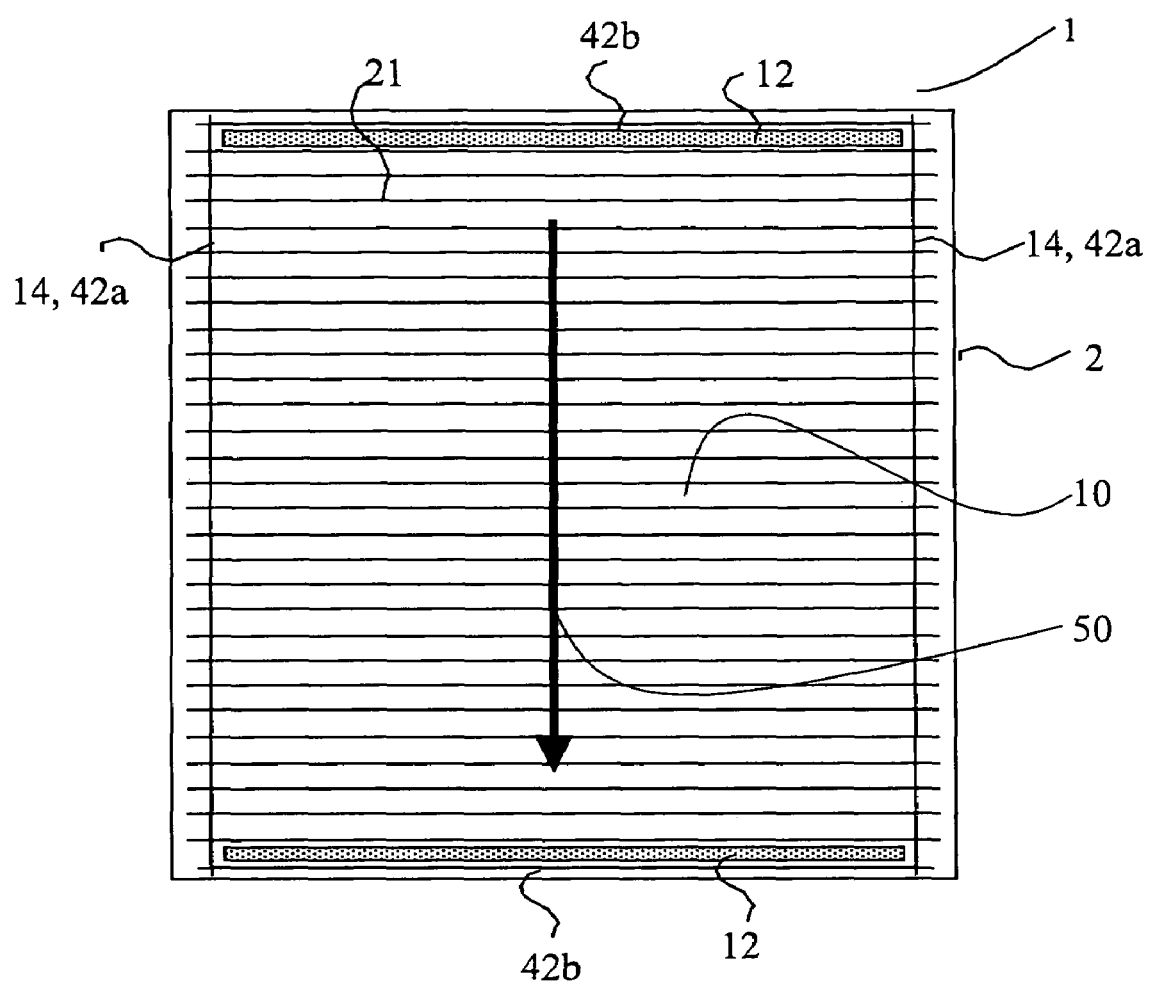
FIG. 1 is a schematic plan view showing an integrated thin film photoelectric converter.
Figure 2:
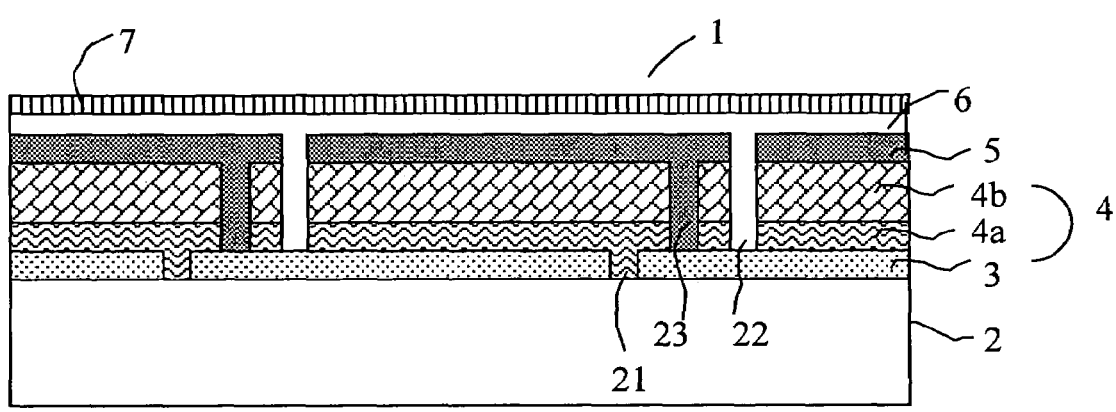
FIG. 2 is a schematic sectional view showing an integrated thin film photoelectric converter.

Hereinafter, more detailed description about embodiments of the present invention will be given. Description will be given about each structural element of a thin film photoelectric converter of the present invention. As a transparent substrate 2, for example, a glass plate, a transparent resin film, etc. may be used. As a glass plate, glass plates having a large dimension may be obtained at low price, and float sheet glass having high transparency and insulative property, having $SiO_2$, $Na_2O$, and CaO as main components, and furthermore having smooth principal surfaces may be used.

A transparent electrode film 3 may be constituted by a transparent conductive oxide layer such as an ITO film, a $SnO_2$ film, or a ZnO film etc. The transparent electrode film 3 may have a single layered structure, or may have a multilayer structure. The transparent electrode film 3 may be formed using any known gaseous phase depositing methods, such as a vacuum deposition method, a CVD method, or a sputtering method. A surface textured structure including fine unevenness is preferably formed on a surface of the transparent electrode film 3. Formation of such a textured structure on the surface of the transparent electrode film 3 may raise incidence efficiency of light to a semiconductor thin film photoelectric conversion unit 4.

A tandem type thin film photoelectric converter has two or more semiconductor thin film photoelectric conversion units, and especially a hybrid type thin film photoelectric converter has an amorphous silicon photoelectric conversion unit 4*a* and a crystalline silicon photoelectric conversion unit 4*b*.

On one hand, the amorphous silicon photoelectric conversion unit 4*a* has an amorphous silicon photoelectric conversion layer, and the layer has a structure wherein a p type layer, an amorphous silicon photoelectric conversion layer, and an n type layer are stacked sequentially from the transparent electrode film 3 side. Each of these p type layer, amorphous silicon photoelectric conversion layers, and n type layers may be formed by a plasma CVD method.

On the other hand, the crystalline silicon photoelectric conversion unit 4*b* has a crystalline silicon photoelectric conversion layer, and for example, the layer has a structure wherein a p type layer, a crystalline silicon photoelectric conversion layer, and an n type layer are stacked sequentially from the amorphous silicon photoelectric conversion unit 4*a* side. Each of these p type layer, crystalline silicon photoelectric conversion layer, and n type layer may be formed by a plasma CVD method.

The p type layer constituting these semiconductor thin film photoelectric conversion units 4a and 4b may be formed, for example, by doping an impurity atom for determining a conductivity type of p type, such as boron and aluminum, into silicon alloys, such as silicon, silicon carbide, and silicon germanium. And the amorphous silicon photoelectric conversion layer and the crystalline silicon photoelectric conversion layer may be formed with amorphous silicon based semiconductor materials and crystalline silicon based semiconductor materials, respectively. As such materials, intrinsic semiconductor silicon (hydrogenated silicon etc.), and silicon alloys, such as silicon carbide and silicon germanium, etc. may be mentioned. Moreover, silicon based semiconductor materials of weak p type or weak n type including a small amount of conductivity type determination impurities may also be used, if they have sufficient photoelectric conversion function. Furthermore, the n type layer may be formed by doping an impurity atom for determining a conductivity type of n type, such as phosphorus and nitrogen, into silicon or silicon alloys, such as silicon carbide and silicon germanium. The amorphous silicon photoelectric conversion unit 4a and the crystalline silicon photoelectric conversion unit 4b that are constituted as mentioned above have mutually different absorption wavelength region. Since a photoelectric conversion layer of the amorphous silicon photoelectric conversion unit 4a is constituted by amorphous silicon, and a photoelectric conversion layer of the crystalline silicon photoelectric conversion unit 4b is constituted by crystalline silicon, the former may be expected to absorb an optic element of approximately 550 nm of wavelength most efficiently, and the latter may be expected to absorb about an optic element of approximately 900 nm of wavelength most efficiently.

On one hand, a thickness of the amorphous silicon photoelectric conversion unit 4a is preferably within a range of 0.01 micrometers to 0.5 micrometers, and more preferably within a range of 0.1 micrometers to 0.3 micrometers.

On the other hand, a thickness of the crystalline silicon photoelectric conversion unit 4b is preferably within a range of 0.1 micrometers to 10 micrometers, and more preferably within a range of 0.1 micrometers to 5 micrometers.

The back electrode film 5 not only has a function as an electrode, but has a function as a reflecting layer for reflecting light that entered from the transparent substrate 2 into the semiconductor thin film photoelectric conversion units 4a and 4b, and that is made to reach the back electrode film 5, the reflecting layer making the reflected light re-enter into the semiconductor thin film photoelectric conversion units 4a and 4b. The back electrode film 5 may be formed to have a thickness of approximately 200 nm to 400 nm by a vacuum deposition method, a sputtering method, etc. using, for example, silver, aluminum, etc.

Between the back electrode film 5 and the semiconductor thin film photoelectric conversion units 4, or between the back electrode film 5 and the crystalline silicon photoelectric conversion unit 4b in case of a hybrid type thin film photoelectric converter, may be formed a transparent conductive thin film (not shown) comprising nonmetallic substance like ZnO in order to improve, for example, adhesive property between both of the films.

Each photoelectric conversion cell 10 formed on the transparent substrate 2 of the integrated thin film photoelectric converter 1 is sealed with an organic protective layer 7 via a sealing resin layer 6. As this sealing resin layer 6, resins enabling adhesion of the organic protective layer onto these cells 10 are used. As such resins, for example, EVA (ethylene vinyl acetate copolymer), PVB (polyvinyl butyral), PIB (polyisobutylene), silicone resins, etc. may be used. As organic protective layer 7, may be used fluororesin films like polyvinyl fluoride films (for example, Tedlar film (registered trademark)) or insulative films excellent in moisture resistance and water resisting property like PET film. The organic protective layer may have a single layered structure, and may have a stacked structure having the single layers stacked therein. Furthermore, the organic protective layer may have a structure wherein a metallic foil comprising aluminum etc. is sandwiched with these films. Since metallic foils like aluminum foil have a function for improving moisture resistance and water resisting property, the organic protective layer having such a structure enables more effective protection of the photoelectric conversion cell 10 from moisture. These sealing resin layer 6/organic protective layer 7 may be simultaneously attached to a back face side of the integrated thin film photoelectric converter 1 by a vacuum laminating method.

Figure 3:
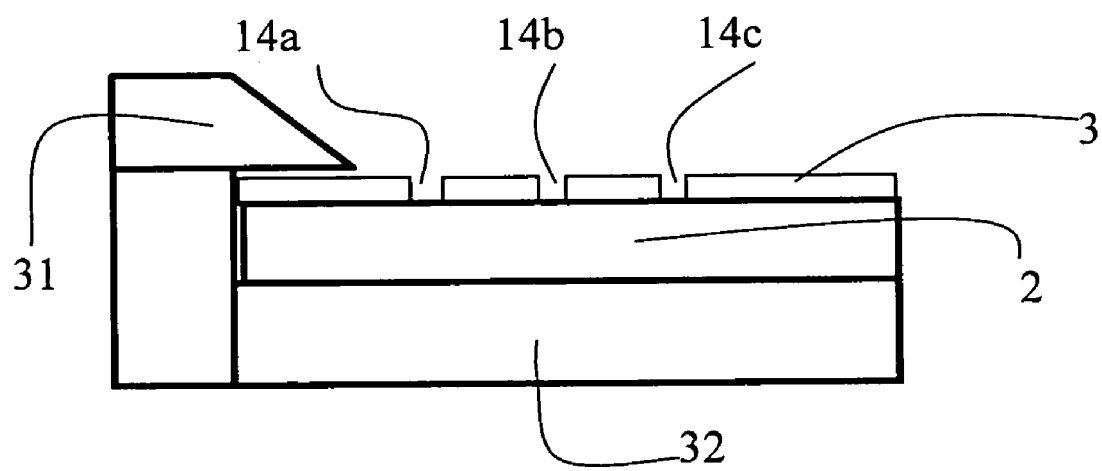
FIG. 3 is a schematic sectional view showing a position of a formed insulated isolation groove.

When a substrate holder 31 as shown in FIG. 3 is used at the time of formation of the crystalline silicon thin film photoelectric conversion unit 4b, as shown in FIG. 3, one or more insulated isolation grooves 14 are formed in parallel with an integration direction 50 that is a direction of series connection of the photoelectric conversion cell 10 shown in FIG. 1 on the transparent electrode film 2.

By the way, the whitish discoloring area is visually observable from a film side after formation of the crystalline silicon thin film photoelectric conversion unit 4b. The whitish discoloring area has a certain amount of uncertainty under completely same conditions. Especially in case of a larger dimension, temperature distribution, plasma density distribution, spatial relationship with the substrate holder, etc. make the uncertainty much more remarkable. This phenomenon increases necessity for control of whitish discoloring area, but the necessity may not be taken into consideration in case of a smaller dimension. Suitable amount of whitish discoloring areas need to exist in suitable areas.

A percentage of a dimension to whole of the photoelectric conversion area of the whitish discoloring area is preferably not more than 5%. If a percentage of the whitish discoloring area exists not less than the percentage mentioned above, drop of short circuit current will exceed improvement in open-circuit voltage and fill factor. In case of an integrated thin film photoelectric converter 1 with a structure integrated in series, the whitish discoloring areas preferably exist on both ends or one end of a side parallel to the integration direction 50 with respect to each photoelectric conversion cell 10 of the integrated thin film photoelectric converter 1. In that case drop of a short circuit current will exceed improvement in an open-circuit voltage and fill factor, when the whitish discoloring areas exist within a range of not less than 2 mm to not more than 10 mm in an inward direction of the photoelectric conversion cell 10 from boundary of the photoelectric conversion cell 10 of parallel side with respect to a direction where photoelectric conversion cell 10 is connected in series, that is an integration direction. In an area of the photoelectric conversion area 52 and a circumference area of the non-photoelectric conversion area on one principal surface of the transparent substrate 2, when the transparent electrode film 2 is divided parallel to the integration direction 50 with borders of the insulated isolation grooves 14, by forming the insulated isolation grooves 14, the whitish discoloring areas tend to appear in a long and slender shape along the boundary in the integration direction 50.

Conversely, when the whitish discoloring areas exist in a side perpendicular to the integration direction, and when only one of a plurality of photoelectric conversion cells 10 is wholly the whitish discoloring area, light sensitivity of the photoelectric conversion cell 10 becomes very low, and short circuit current will become small. Therefore, in this case, even if a percentage of a dimension of whitish discoloring area is not more than 5%, a short circuit current of an integrated thin film photoelectric converter 1 as a whole will become extremely small, due to serial integration structure thereof, causing decrease in photoelectric conversion efficiency.

The whitish discoloring area does not actually formed with a same dimension in all of the photoelectric conversion cells 10, and therefore if they are formed on both ends with a width of approximately 6 mm on an average, and if the whitish discoloring areas are not formed in a direction perpendicular to the integration direction 50, a percentage of the whitish discoloring areas becomes not more than 5%, when a length of direction perpendicular to the integration direction 50 of the photoelectric conversion cell is not less than 240 mm. In fact, not only on both ends of a direction parallel to the integration direction of the integrated thin film photoelectric converter 1, but on both ends of a direction perpendicular to the integration direction, the whitish discoloring areas of an almost same percentage will be formed. For this reason, when integration of the converter is to be performed so as to exclude the cloudy portion in this direction perpendicular to the integration direction, a size of the integrated thin film photoelectric converter 1 needs to be not less than 600 cm$^2$, that is, not less than 240 mm×250 mm, in order to realize an integrated thin film photoelectric converter 1 having not more than 5% of whitish discoloring areas, and having a width from a boundary parallel to the integration direction of not less than 2 mm and not more than 10 mm.

Although the whitish discoloring areas can be easily distinguished from a film side also after formation of the back electrode, film 5, the areas may hardly be distinguished by visual inspection from a surface on which the semiconductor thin film photoelectric conversion unit 4 of the transparent substrate 2 is not formed, after sealing by resins etc. However, these areas may be distinguished from a surface of the transparent substrate 2 on which the semiconductor thin film photoelectric conversion unit is not formed by spectral reflectance measurement using a spectrum reflectometer. In spectrum reflective measurement, measured is a reflection including diffusion components with an incident angle of 10 degrees using an integrating sphere, determining a value on the basis of barium sulfate board. The whitish discoloring area may be determined by a definition that the whitish discoloring area has a spectral reflectance in 800 nm in spectral reflectance measurement on the conditions not less than 5% as large as a spectral reflectance of areas without whitish discoloring.

EXAMPLE

Example 1

A glass substrate 2 having a SnO$_2$ film 3 formed on one principal surface and having a size measuring 910 mm×910 mm was prepared. Isolation grooves 21 and insulated isolation grooves 14 were formed by a laser scriber in an SnO$_2$ film 3 formed on a surface of this glass substrate, as shown in FIG. 1. As shown in FIG. 3, at the time of installation to a substrate holder 31 of the plasma CVD device, a first insulation isolation groove 14$a$ having a width of approximately 100 micrometers was formed approximately 1 mm spaced apart from an inner circumference of the substrate holder 31. Furthermore, a second insulation isolation groove 14$b$ having a width of approximately 100 micrometers was formed in a position having approximately 0.7 mm apart inside from the first insulation isolation groove 14$a$.

In case of formation of a crystalline silicon photoelectric conversion unit 4$b$ with a high power density of not less than 100 mW/cm$^2$ by a plasma CVD method on a substrate having a large dimension of not less than 1200 cm$^2$, these insulation isolation grooves 14 insulate the substrate holder 31 from a transparent conducting layers 2 on a surface of the substrate to prevent abnormal discharge.

The glass substrate 2 having one sheet of SnO$_2$ film 3 to which the above-mentioned laser scribe was given was held in the substrate holder 31. Allowing for a shift of a position of the glass substrate 2 at this time, a distance from an inner circumference of the substrate holder 31 to the first insulation isolation groove 14$a$ would be in a range of 3±2 mm. A substrate holder 31 holding the glass substrate 2 was carried in within a CVD system with an electrode (115 cm×118 cm) installed. A silane, hydrogen, methane, and diborane were introduced as reactive gases. After formation of a p type layer, the silane was introduced as a reactive gas to form an amorphous silicon photoelectric conversion layer. After that, the silane, hydrogen, and phosphine were introduced to form an n type layer as reactive gases. An amorphous silicon photoelectric conversion unit 4$a$ was thus formed.

Then, the silane, hydrogen, and diborane were introduced as reactive gases to form a p type layer, and subsequently hydrogen and the silane were introduced as reactive gases under flow rate conditions shown in Example 1 of Table 1 to form a crystalline silicon photoelectric conversion layer. After that, the silane, hydrogen, and phosphine were introduced as reactive gases to form an n type layer. A crystalline silicon photoelectric conversion unit 4$b$ was thus formed.

Figure 4:
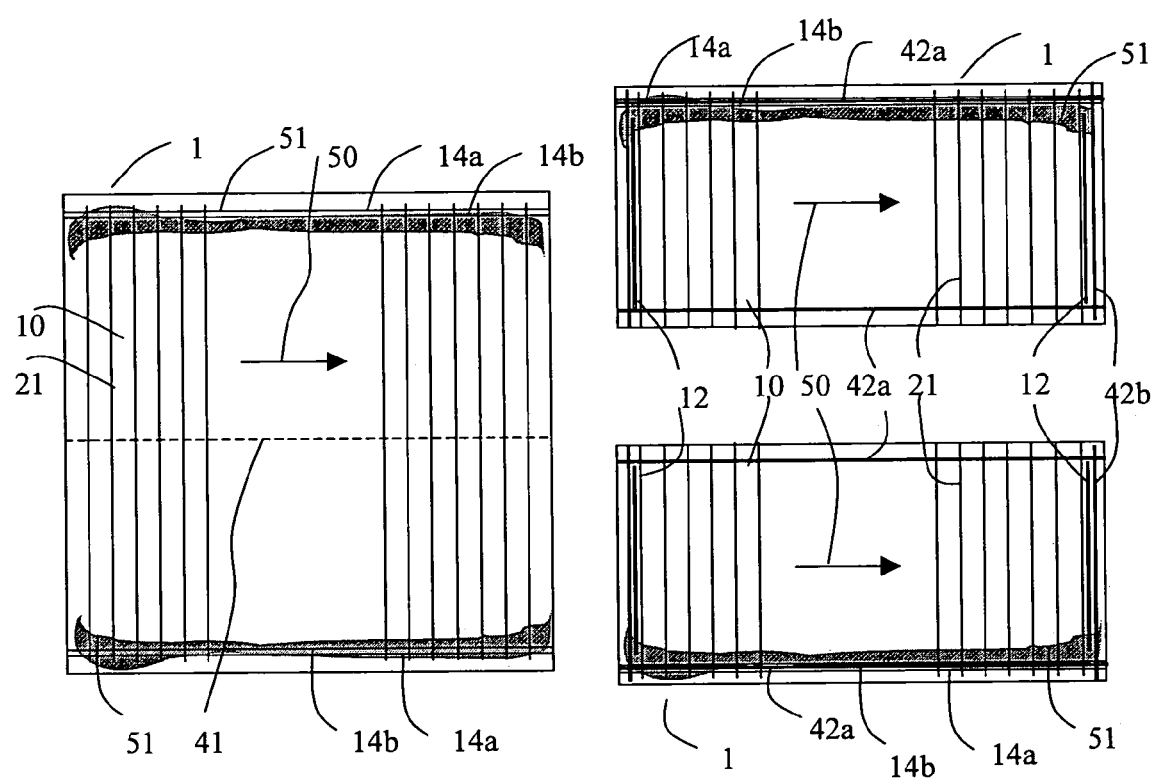
FIG. 4 is a schematic plan view showing an integrated thin film photoelectric converter having a substrate of a square measuring 910 mm×910 mm, and also showing the converter being divided into portions of two rectangles measuring 910 mm×455 mm.

After formation of the crystalline silicon photoelectric conversion unit 4$b$, the amorphous silicon photoelectric conversion unit 4$a$ and the crystalline silicon photoelectric conversion unit 4$b$ were laser scribed to form a connection groove 23. And furthermore, a back electrode film 5 as a double layer film of a ZnO film and an Ag film as a back electrode film was formed by a sputtering method. Then, the amorphous silicon photoelectric conversion unit 4$a$, the crystalline silicon photoelectric conversion unit 4$b$, and the back electrode film 5 were laser scribed to form an isolation groove 22. Furthermore, the circumference insulation grooves 42$a$ and 42$b$ shown in FIG. 4 were formed by laser scribing of the SnO$_2$ film 3, the amorphous silicon photoelectric conversion unit 4$a$, the crystalline silicon photoelectric conversion unit 4$b$, and the back face electrode film 5. Before attachment of lead wires 12, as shown in FIG. 4, the substrate was divided into a half size along with a cutting line 41 in a direction parallel to the integration direction 50. Thus a hybrid type integrated thin film photoelectric converter 1 with a size of 910 mm×455 mm wherein 100 of photoelectric conversion cells 10 having a size of 8.9 mm×430 mm were connected in series was produced. Here, the circumference insulation grooves 42$a$ were formed on the insulated isolation grooves 14 beforehand formed on the SnO$_2$ film 3.

Figure 5:
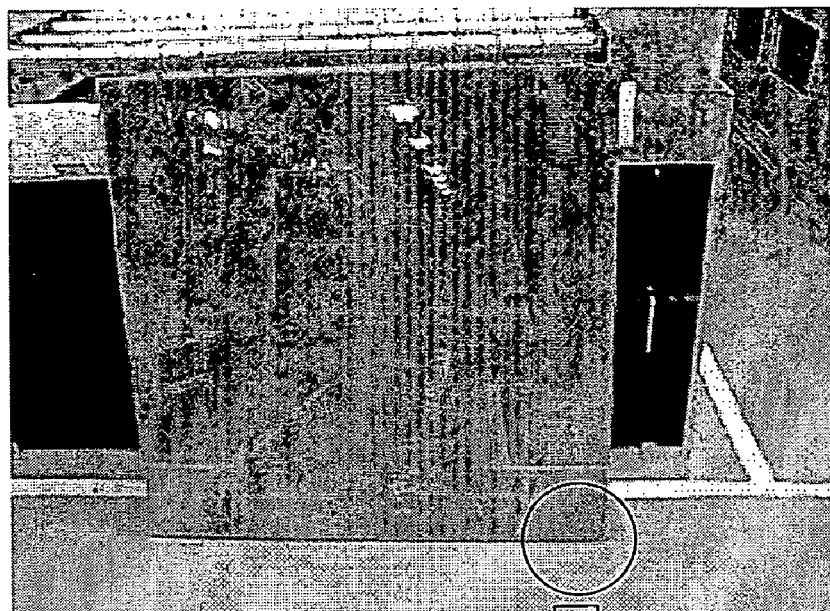
FIG. 5 shows a photograph of a film surface, and an enlarged photograph of whitish discoloring areas after formation of the crystalline silicon photoelectric conversion unit in a substrate of square measuring 910 mm×910 mm.
Figure 5:
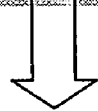
Figure 5:
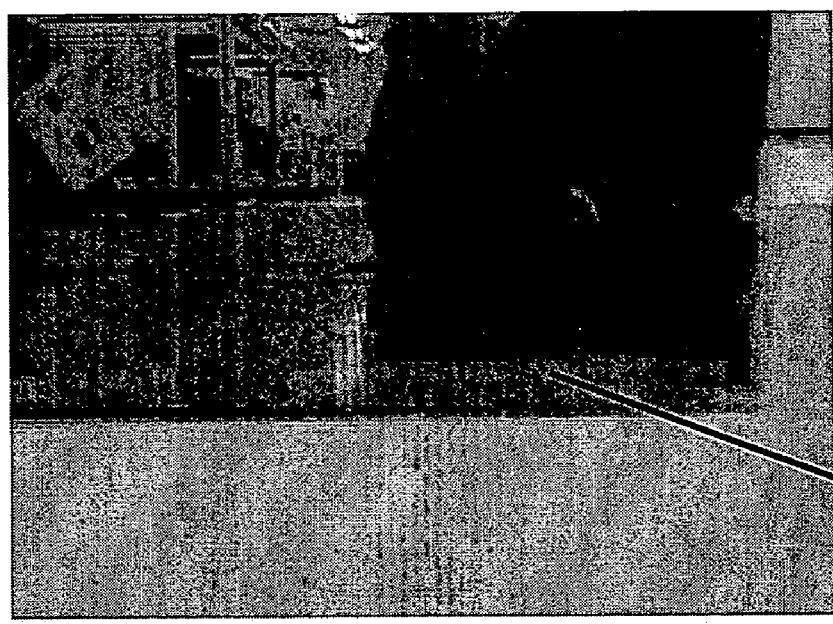

A surface of the crystalline silicon photoelectric conversion unit 4$b$ of this hybrid type integrated thin film photoelectric converter 1 was observed after formation of the conversion unit 4$b$, and whitish discoloring areas 51 discolored in white were observed on both ends of the photoelectric conversion cell 10, as schematically shown in FIG. 4. FIG. 5 shows a visual appearance photograph of the whitish discoloring areas. In case of a hybrid type integrated thin film photoelectric converter 1 with a size measuring 910 mm×455 mm, this whitish discoloring area 51 existed within a width of not less than 5 mm and not more than 10 mm from one of the circumference insulation isolation grooves 42a parallel to the integration direction 50. When an area surrounded with the circumference insulation isolation grooves 42a and 42b is defined as a photoelectric conversion area 52 here, the whitish discoloring area 51 occupied an area of approximately 2% to a gross dimension of the photoelectric conversion area 52.

Measured was a sample wherein the hybrid type integrated thin film photoelectric converter 1 having the whitish discoloring area 51 for a spectral reflectance using a light entered from a glass surface 2 side. Measurement of the spectral reflectance was carried out by measuring a reflection including diffusion components with an incident angle of 10 degrees using an integrating sphere on the basis of barium sulfate board. Measured result showed that the whitish discoloring area 51 had a value not less than 5% larger than a value in a normal area in spectral reflectance in 800 nm. That is, a test result of spectral reflectance for 9 points shown in FIG. 6 as shown in Example 1 of Table 2 gave a difference of the absolute values of 12.1%. Here, points of measurement of 1, 4, and 7 correspond to the whitish discoloring areas 51, and points of measurement of 2, 3, 5, 6, 8, and 9 correspond to the normal areas.

An initial output as an output before photodegradation by optical exposure of this hybrid type integrated thin film photoelectric converter 1 may be obtained from a an electrical property of a light of a solar simulator of AM 1.5 using a xenon and a halogen lamp as a light source having an irradiance of 100 mW/cm$^2$ being entered from a glass surface side. A measurement temperature was set at 25 degrees C. As shown in Example 1 of Table 3, the initial output gave 42.8 W. At this time, a short circuit current, an open-circuit voltage, and a fill factor gave 0.456 A, 135.5 V, and 0.692, respectively.

Table 1 shows relationship between film-formation flow rate conditions of the crystalline silicon photoelectric conversion layers, and the whitish discoloring areas in the hybrid type integrated thin film photoelectric converters of each of Examples and Comparative Examples.

Table 2 shows spectral reflectances at 800 nm of the hybrid type integrated thin film photoelectric converters in each of Examples and Comparative Examples.

Table 3 shows photoelectric transfer characteristics of the hybrid type integrated thin film photoelectric converter in each of Examples and Comparative Examples.

Comparative Example 1

Except for having formed a crystalline silicon photoelectric conversion layer under a flow rate conditions shown in Comparative Example 1 of Table 1, a hybrid type integrated thin film photoelectric converter 1 of Comparative Example 1 was produced in a same manner as in Example 1. In the hybrid type integrated thin film photoelectric converter 1 of Comparative Example 1, obtained was a hybrid type integrated thin film photoelectric converter 1 having a size measuring 910 mm×455 mm in which whitish discoloring area 51 was not recognized by film side observation before sealing. As in Example 1, measurement of an initial output and a spectral reflectance of the hybrid type integrated thin film photoelectric converter 1 of Comparative Example 1 gave results of Comparative Example 1 in Table 3, and Comparative Example 1 in Table 2, respectively. A difference of absolute values of spectral reflectance at 800 nm gave not more than 5%, the initial output gave 40.1 W, and the short circuit current, the open-circuit voltage, and the fill factor gave 0.455 A, 129.5 V, and 0.681, respectively. The Comparative Example 1 gave obviously a lower open-circuit voltage and a fill factor as compared with those in Example 1, and also gave a low value for the initial output.

TABLE 1

| No. | Silane flow rate (sccm) | Hydrogen flow rate (slm) | Whitish discoloring area existence | Width from boundary (mm) | Percentage of whitish discoloring area to photoelectric conversion area (%) |
| --- | --- | --- | --- | --- | --- |
| Example 1 | 450 | 50 | One end | 5~10 | 2.0 |
| Comparative Example 1 | 420 | 50 | Not observed | 0 | 0.0 |
| Example 2 | 480 | 50 | One end | 15~30 | 5.5 |
| Example 3 | 130 | 15 | Both ends | 2~6 | 3.0 |
| Comparative Example 2 | 120 | 15 | Not observed | 0 | 0.0 |
| Example 4 | 150 | 15 | Both ends | 5~16 | 5.2 |

TABLE 2

| Reflectance No. | Point of measurement 1 (%) | | | | | | | | | max–min [%] |
| --- | --- | --- | --- | --- | --- | --- | --- | --- | --- | --- |
| | 1 (%) | 2 (%) | 3 (%) | 4 (%) | 5 (%) | 6 (%) | 7 (%) | 8 (%) | 9 (%) | |
| Example 1 | 18.6 | 15.2 | 14.8 | 24 | 15.5 | 14.3 | 26.4 | 15.3 | 15.1 | 12.1 |
| Comparative Example 1 | 17.2 | 15.1 | 14.5 | 17 | 15.3 | 14.3 | 17.5 | 15.5 | 14.8 | 3.2 |
| Example 2 | 20.6 | 14.3 | 14.8 | 23.2 | 16.3 | 13.8 | 25.5 | 17.3 | 16.4 | 11.7 |
| Example 3 | 18.8 | 15.1 | 23.1 | 24 | 14.3 | 20.1 | 24.2 | 15.5 | 23.8 | 9.9 |
| Comparative Example 2 | 16.3 | 15.2 | 15.8 | 16.2 | 14.2 | 15.6 | 15.5 | 14.9 | 16 | 2.1 |
| Example 4 | 20.8 | 16.3 | 22.5 | 23.3 | 15.9 | 21.7 | 25.5 | 17.2 | 24.4 | 9.6 |

TABLE 3

| Characteristic No. | Open Circuit voltage Voc[V] | Short Circuit current Isc[A] | Fill Factor FF[%] | Initial Output Power[W] |
|---|---|---|---|---|
| Example 1 | 135.5 | 0.456 | 69.2 | 42.8 |
| Comparative Example 1 | 129.5 | 0.455 | 68.1 | 40.1 |
| Example 2 | 136.7 | 0.441 | 68.3 | 41.2 |
| Example 3 | 37.8 | 0.439 | 74.1 | 12.3 |
| Comparative Example 2 | 37.0 | 0.441 | 72.5 | 11.8 |
| Example 4 | 38.1 | 0.435 | 72.8 | 12.1 |

Example 2

Except for having formed a crystalline silicon photoelectric conversion layer under a flow rate condition shown in Example 2 of Table 1, a hybrid type integrated thin film photoelectric converter 1 of Example, 2 was produced in a same manner as in Example 1. In the hybrid type integrated thin film photoelectric converter 1 of Example 2, by a film side observation before sealing, whitish discoloring areas 51 discolored white were identified on both ends of the photoelectric conversion cell 10 as shown in FIG. 4. In case of the hybrid type integrated thin film photoelectric converter 1 having a size measuring 910 mm×455 mm, this whitish discoloring area 51 existed in a range of not less than 15 mm and not more than 30 mm from one of the two circumference insulation isolation grooves 42a parallel to the integration direction 50. The whitish discoloring areas 51 occupied approximately 5.5% to a gross dimension of the photoelectric conversion area 52.

Figure 6:
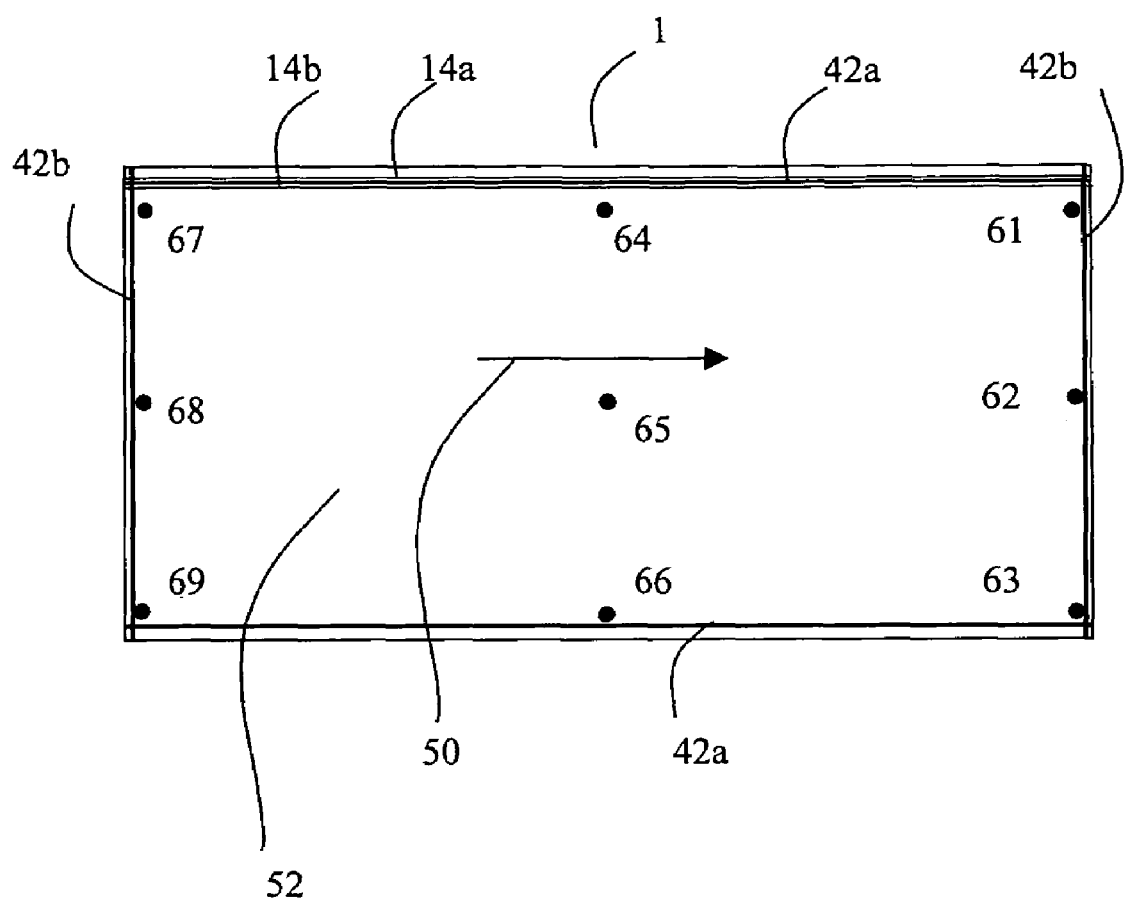
FIG. 6 is view showing measured points of spectral reflectance of an integrated thin film photoelectric converter of a rectangular measuring 910 mm×455 mm.

The hybrid type integrated thin film photoelectric converter 1 of Example 2 was measured for spectral reflectances at 9 points as shown in FIG. 6 in a same manner as in Example 1. As shown in Example 2 in Table 2, a difference of absolute values of spectral reflectances at 800 nm gave 11.7%. Here, points of measurement 1, 4, and 7 correspond to whitish discoloring areas 51, and points of measurement 2, 3, 5, 6, 8, and 9 correspond to normal areas.

Measurement in a same manner as in Example 1 of an initial output of the hybrid type integrated thin film photoelectric converter 1 of Example 2 gave 41.2 W, as shown in Example 2 in Table 3. A short circuit current, an open-circuit voltage, and a fill factor gave 0.441 A, 136.7 V, and 0.683, respectively. Example 2 gave a higher open-circuit voltage and a higher fill factor as compared with those in Comparative Example 1, and also gave a higher initial output. And it gave a little lower value of a short circuit current and also a little low initial output as compared with those in Example 1.

Example 3

Figure 7:
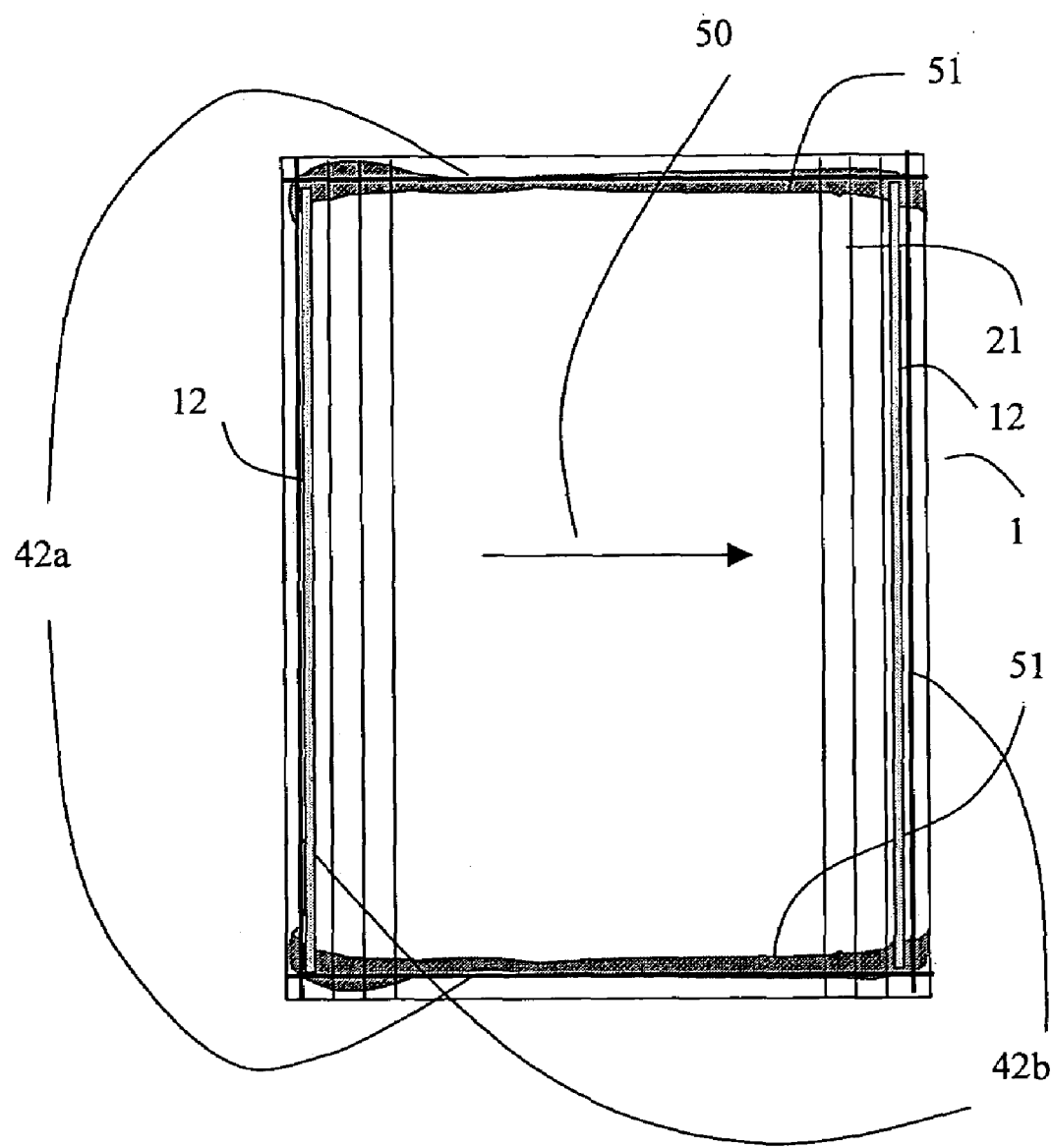
FIG. 7 is a schematic plan view showing an integrated thin film photoelectric converter of a rectangles measuring 300 mm×400 mm formed on a substrate of a rectangular measuring 360 mm×465 mm.

A glass substrate 2 having an $SnO_2$ film 3 formed on one principal surface thereof and having a size measuring 365 mm×465 mm was prepared, and isolation grooves 21 were formed on this substrate, as shown in FIG. 7.

Without using a substrate holder, the glass substrate 2 was moved in a position having an electrode size measuring 400 mm×500 mm of a single wafer processing plasma CVD device enabling conveyance of the glass substrate 2 with a conveying fork, and an amorphous silicon photoelectric conversion unit 4a and a crystalline silicon photoelectric conversion unit 4b were formed using a same gas composition as in Example 1. This time, a crystalline silicon photoelectric conversion layer was formed under flow rate conditions shown in Example 3 in Table 1. After formation of the crystalline silicon photoelectric conversion unit 4b, connection grooves 23 were formed by a laser scribe method, and then a back electrode film 5 as a double layer film of a ZnO film and an Ag film was formed as a back electrode film by a sputtering method. Then, isolation grooves 22, and circumference insulation grooves 42a and 42b as shown in FIG. 4 were formed by a laser scribe method. And subsequently, lead wires 12 was attached to produce a hybrid type integrated thin film photoelectric converter 1 having a size measuring 300 mm×400 mm wherein 28 pieces of photoelectric conversion cells 10 with a size measuring 8.9 mm×380 mm were connected in series together.

As schematically shown in FIG. 7, whitish discoloring areas 51 colored white on both ends of the photoelectric conversion cell 10 were identified by observation from a film side before sealing of this hybrid type integrated thin film photoelectric converter 1. The whitish discoloring areas 51 were observed in a range of not less than 2 mm and not more than 6 mm from both of the circumference insulation isolation grooves 42a parallel to the integration direction 50, and a percentage of the whitish discoloring areas 51 gave approximately 3% to a gross dimension of the photoelectric conversion area 52.

Figure 8:
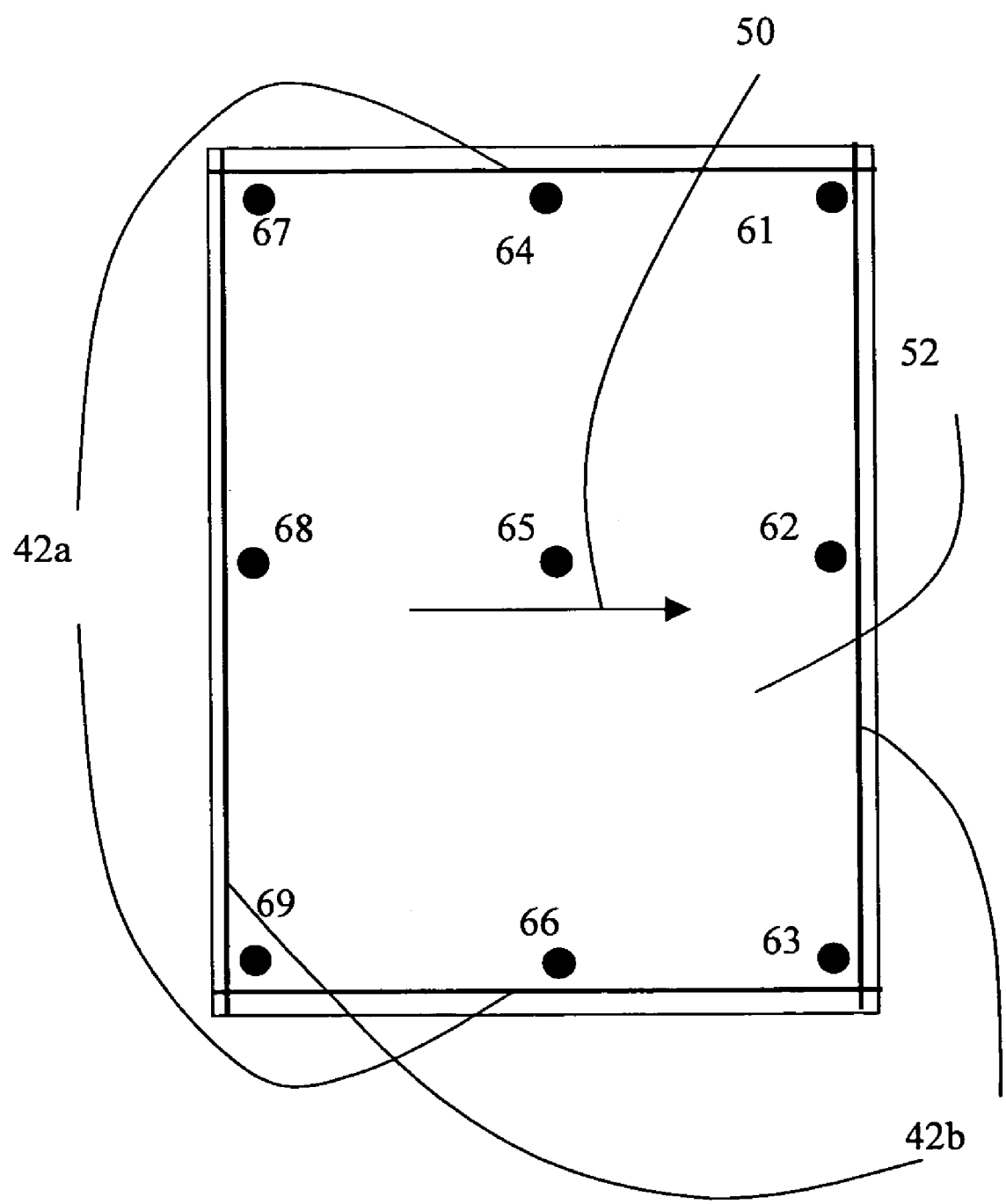
FIG. 8 is a view showing measured points of spectral reflectance of an integrated thin film photoelectric converter of a rectangular measuring 300 mm×400 mm.

The hybrid type integrated thin film photoelectric converter 1 of Example 3 was measured for a spectral reflectance in 9 points as shown in FIG. 8 in a same manner as in Example 1. As shown in Example 3 in Table 2, a difference of absolute values of the spectral reflectance at 800 nm gave 9.9%. Here, points of measurement 1, 3, 4, 6, 7, and 9 correspond to the whitish discoloring area 51, and points of measurement 2, 5, and 8 correspond to normal areas.

The hybrid type integrated thin film photoelectric converter 1 of this Example 3 was measured for an initial output in a same manner as in Example 1 to obtain 12.3 W as shown in Example 3 in Table 3. At this time, a short circuit current, an open-circuit voltage, and a fill factor gave 0.439 A, 37.8 V, and 0.741, respectively.

Comparative Example 2

Except for having formed a crystalline silicon photoelectric conversion layer under flow rate conditions shown in Comparative Example 2 in Table 1, a hybrid type integrated thin film photoelectric converter 1 of Comparative Example 2 was produced in a same manner as in Example 3. In the hybrid type integrated thin film photoelectric converter 1 of Comparative Example 2, obtained was a hybrid type integrated thin film photoelectric converter 1 having a size measuring 300 mm×400 mm wherein whitish discoloring areas 51 were not recognized by observation from a film side before sealing. The hybrid type integrated thin film photoelectric converter 1 of Comparative Example 2 was measured for an initial output and spectral reflectance in a same manner as in Example 1 to obtain results for Comparative Example 2 in Table 2, and for Comparative Example 2 in Table 3, respectively. A difference of absolute values of the spectral reflectance at 800 nm gave not more than 5%, and an initial output gave 11.8 W. A short circuit current, an open-circuit voltage, and a fill factor gave 0.441 A, 37.0 V, and 0.681, respectively. The Comparative Example 2 showed obviously lower open-circuit voltage and fill factor as compared with those in Example 3, and also showed a lower initial output.

Example 4

A crystalline silicon photoelectric conversion layer formed under flow rate conditions shown in Example 4 in Table 1 gave whitish discoloring areas 51 discolored white on both ends of a photoelectric conversion cell 10, as schematically shown in FIG. 7. In case of the obtained layer used for a hybrid type integrated thin film photoelectric converter 1 having a size measuring 300 mm×400 mm, this whitish discoloring area 51 existed in a range of not less than 5 mm and not more than 16 mm from one of two circumference insulation isolation grooves 42a parallel to the integration direction 50. A percentage of the whitish discoloring area 51 to a gross dimension of the photoelectric conversion area 52 gave approximately 5.2%. Measurement, in a same manner as in Example 1, of spectral reflectance in 9 points as shown in FIG. 8 gave 9.6% of difference of absolute values of spectral reflectance in 800 nm as shown in Example 4 of Table 2.

A same measurement as in Example 1 gave 12.1 W for initial out, as shown in Example 4 in Table 3. A short circuit current, an open-circuit voltage, and a fill factor gave 0.435 A, 38.1 V, and 0.728, respectively. Example 4 gave a higher open-circuit voltage and a higher fill factor, and also a higher initial output as compared with that in Comparative Example 2. And it gave a little lower short circuit current and a little lower initial output as compared with those in Example 2.

DESCRIPTION OF NOTATIONS

1 Integrated thin film photoelectric converter
2 Transparent substrate
3 Transparent electrode film
4a and 4b Semiconductor thin film photoelectric conversion unit
5 Back electrode film
6 Sealing resin layer
7 Organic protective layer
10 Photoelectric conversion cell
12 Lead wire
14a, 14b, and 14c Insulated isolation groove
21 and 22 Isolation groove
23 Connection groove
31 Substrate holder
32 Back plate
41 Cutting line
42a, 42b Circumference insulation isolation groove
50 Integration direction
51 Cloudy discoloring area
52 Photoelectric conversion area
61 Point of measurement for spectral reflectance 1
63 Point of measurement for spectral reflectance 2
63 Point of measurement for spectral reflectance 3
64 Point of measurement for spectral reflectance 4
65 Point of measurement for spectral reflectance 5
66 Point of measurement for spectral reflectance 6
67 Point of measurement for spectral reflectance 7
68 Point of measurement for spectral reflectance 8
69 Point of measurement for spectral reflectance 9

INDUSTRIAL APPLICABILITY

As described in full detail above, a thin film photoelectric converter of the present invention is a thin film photoelectric converter including a crystalline silicon photoelectric conversion unit, it has a whitish discoloring areas in a crystalline silicon photoelectric conversion layer, and it may solve problems of obtaining a small open-circuit voltage and a fill factor, and as a result it may provide a thin film photoelectric converter having an improved photoelectric conversion efficiency. Furthermore, the present invention enables discrimination of quality of the photoelectric conversion characteristic of the obtained thin film photoelectric converter immediately after completion of formation of the crystalline silicon photoelectric conversion unit.

The invention claimed is:

1. A thin film photoelectric converter comprising:
a transparent electrode film on a transparent substrate;
a crystalline silicon photoelectric conversion unit formed on the transparent electrode film and having a photoelectric conversion area;
a back electrode film formed on the crystalline silicon photoelectric conversion unit;
a plurality of isolation grooves isolating the transparent electrode film, the crystalline silicon photoelectric conversion unit and the back electrode film so as to form a plurality of photoelectric conversion cells;
a plurality of connection grooves electrically connecting the plurality of photoelectric conversion cells in series in an integration direction; and
a whitish discoloring area formed in the photoelectric conversion area so as to extend alone a boundary parallel to the integration direction of photoelectric conversion area in a range of not less than 2 mm and not more than 10 mm from the boundary of the photoelectric conversion area, the whitish discoloring area occupying not more than 5% of the photoelectric conversion area, wherein the whitish discoloring area occupies not less than 2% of the photoelectric conversion area of the thin film photoelectric converter, wherein the whitish discoloring area is attributed to crystallinity difference in the crystalline silicon as a material of the crystalline silicon photoelectric conversion layer.

2. The thin film photoelectric converter according to claim 1, further comprising:
an amorphous silicon photoelectric conversion unit formed between the transparent electrode film and the crystalline silicon photoelectric conversion unit.

3. The thin film photoelectric converter according to claim 1, wherein a dimension having the semiconductor thin film photoelectric conversion unit formed therein is not less than 600 cm$^2$.

* * * * *